(12) United States Patent
Shang et al.

(10) Patent No.: US 8,810,499 B2
(45) Date of Patent: Aug. 19, 2014

(54) SHIFT REGISTER UNIT, SHIFT REGISTER, DISPLAY PANEL AND DISPLAY

(75) Inventors: Guangliang Shang, Beijing (CN); Tianyue Zhao, Beijing (CN); Changlin Leng, Beijing (CN)

(73) Assignee: Boe Technology Group Co., Ltd., Beijing (CN)

(*) Notice: Subject to any disclaimer, the term of this patent is extended or adjusted under 35 U.S.C. 154(b) by 301 days.

(21) Appl. No.: 13/448,760

(22) Filed: Apr. 17, 2012

(65) Prior Publication Data

US 2012/0262438 A1 Oct. 18, 2012

(30) Foreign Application Priority Data

Apr. 18, 2011 (CN) .......................... 2011 1 0096901

(51) Int. Cl.
*G09G 3/36* (2006.01)

(52) U.S. Cl.
USPC .......................................................... 345/100

(58) Field of Classification Search
CPC ...... G11C 19/00; G11C 27/00; G11C 19/287; G11C 19/38; G11C 27/04; G11C 29/20; G09G 2310/0286
USPC ..................... 315/169.2; 340/12.21; 345/100; 377/64–81
See application file for complete search history.

(56) References Cited

U.S. PATENT DOCUMENTS

2012/0113088 A1* 5/2012 Han et al. ...................... 345/212

* cited by examiner

*Primary Examiner* — Dwayne Bost
*Assistant Examiner* — Christopher Kohlman
(74) *Attorney, Agent, or Firm* — Ladas & Parry LLP

(57) ABSTRACT

The disclosure discloses a shift register unit, a shift register, a display panel and a display, and belongs to display driving technology. The shift register unit comprises: twelve transistors M1, M2, ..., M12; one capacitor C1; four signal input terminals INPUT, RESET, CLK, CLKB; one signal output terminal OUTPUT; and one or more power supply terminals. The disclosure may decrease the output delay and attenuation, and improve an anti-interference capability, so that the shift register may operate stably and a driving margin of the shift register could be increased.

17 Claims, 3 Drawing Sheets

SHIFT REGISTER UNIT, SHIFT REGISTER, DISPLAY PANEL AND DISPLAY

TECHNICAL FIELD OF THE DISCLOSURE

The present disclosure relates to display driving technology, and particularly to a shift register unit, a shift register, and a display panel and a display including the shift register.

BACKGROUND

Existing shift register commonly comprises transistors and capacitors, and its internal delay is mainly caused by a prolonged turn-on time period of the transistors and attenuation. Therefore, the existing shift register has shortcomings that its delay is long and a reset speed for a node in the existing shift register is slow, such that charging at the node of the shift register is affected and an output delay and attenuation are further deteriorated, which in turn renders the shift register operating unstably.

SUMMARY

Technical Problem to be Solved

Technical problems to be solved by the embodiments of the disclosure are how to decrease the output delay and attenuation, and to improve an anti-interference capability, so that the shift register may operate stably and a driving margin of the shift register could be increased.

Solution of the Disclosure

In one embodiment of the disclosure, there is provided a shift register unit, comprising: twelve transistors M1, M2, . . . , M12; one capacitor C1; four signal input terminals INPUT, RESET, CLK, CLKB; one signal output terminal OUTPUT; and one power supply terminal VSS, and connection relationships among them are as follows:

a gate of the M1 is connected to both the signal input terminal INPUT and gates of the M6 and M9, and a source of the M1 is connected to drains of the M2 and M11;

a gate of the M2 is connected to the signal input terminal RESET;

both a gate and a drain of the M5 are connected to the signal input terminal CLKB, and a source of the M5 is connected to drains of the M6 and M7;

a gate of the M8 is connected to the source of the M5, a drain of the M8 is connected to both drains of the M9 and M10 and gates of the M11 and M12;

a drain of the M3 is connected to the signal input terminal CLK, a gate of the M3 is connected to one end of the capacitor C1 and the source of the M1, and a source of the M3 is connected to the other end of the capacitor C1, gates of the M7 and M10, drains of the M12 and M4 and the signal output terminal OUTPUT;

sources of M2, M11, M6, M7, M9, M10, M12 and M4 are connected to the power supply terminal VSS, and a gate of the M4 is connected to the signal input terminal RESET.

The shift register unit further comprises two additional signal input terminals: fifth signal input terminal and sixth signal input terminal. A drain of the M1 is connected to the fifth signal input terminal, and when the gate of the M1 is at the high level, the signal input terminal at the drain of the M1 is also at a high level. A source of the M8 is connected to the sixth signal input terminal, and when the gate of the M8 is at the high level, the signal input terminal at the source of the M8 is also at a high level.

In one example, two power supply terminals VDD1, VDD2 are further involved; the fifth signal input terminal connected with the drain of the M1 is connected to the power supply terminal VDD1; and the sixth signal input terminal connected with the source of the M8 is connected to the power supply terminal VDD2.

In one example, the fifth signal input terminal connected with the drain of the M1 is said signal input terminal INPUT, and the drain of the M1 is also connected to gates of the M6 and M9; the sixth signal input terminal connected with the source of the M8 is the signal input terminal CLKB, and the source of the M8 is also connected to both the gate and the drain of the M5.

In one example, one power supply terminal VDD1 is further involved; the fifth signal input terminal connected with the drain of the M1 is connected to the power supply terminal VDD1; the sixth signal input terminal connected with the source of the M8 is connected to the signal input terminal CLKB, and the source of the M8 is also connected to both the gate and the drain of the M5.

In another embodiment of the disclosure, there is further provided a shift register including a plurality of shift register units, each shift register unit comprising: twelve transistors M1, M2, . . . , M12; one capacitor C1; four signal input terminals INPUT, RESET, CLK, CLKB; one signal output terminal OUTPUT; and one power supply terminal VSS, and connection relationships among them are as follows:

a gate of the M1 is connected to both the signal input terminal INPUT and gates of the M6 and M9, and a source of the M1 is connected to drains of the M2 and M11;

a gate of the M2 is connected to the signal input terminal RESET;

both a gate and a drain of the M5 are connected to the signal input terminal CLKB, and a source of the M5 is connected to drains of the M6 and M7;

a gate of the M8 is connected to the source of the M5, a drain of the M8 is connected to both drains of the M9 and M10 and gates of the M11 and M12;

a drain of the M3 is connected to the signal input terminal CLK, a gate of the M3 is connected to one end of the capacitor C1 and the source of the M1, and a source of the M3 is connected to the other end of the capacitor C1, gates of the M7 and M10, drains of the M12 and M4 and the signal output terminal OUTPUT;

sources of M2, M11, M6, M7, M9, M10, M12 and M4 are connected to the power supply terminal VSS, and a gate of the M4 is connected to the signal input terminal RESET.

The shift register unit further comprises two additional signal input terminals: fifth signal input terminal and sixth signal input terminal. A drain of the M1 is connected to the fifth signal input terminal, and when the gate of the M1 is at the high level, the signal input terminal at the drain of the M1 is also at a high level. A source of the M8 is connected to the sixth signal input terminal, and when the gate of the M8 is at the high level, the signal input terminal at the source of the M8 is also at a high level.

In one example, the shift register comprises a cascade of a plurality of the shift register units.

In another embodiment of the disclosure, there is further provided a display panel including said shift register as a gate driver of the display panel.

In another embodiment of the disclosure, there is further provided a display including the display panel.

Effect of the Disclosure

The disclosure may reduce a reset delay by designing a circuit, so that the output delay and attenuation of the shift register may be decreased. In the circuit of the disclosure, PU node has no direct affections to the resets of PD and PD_CN nodes, which reduces noise interference and enhances the operation stability of the shift register.

DETAILED DESCRIPTION

Below detailed implementations of the disclosure will be described in further details in connection with the accompanying drawings and embodiments. The following embodiments are only used to illustrate the disclosure, but not intend to limit the scope of the disclosure.

First Embodiment

The shift register unit in the first embodiment of the disclosure includes: twelve transistors M1, M2, . . . , M12 (all of them are P-channel transistors); one capacitor C1; four signal input terminals INPUT, RESET, CLK (a clock signal), CLKB (an inversed signal of the clock signal CLK); one output terminal OUTPUT; and three power supply terminals VSS, VDD1, VDD2, wherein the VSS is always at a low level, the VDD1 and VDD2 are always at a high level, and voltages of the VDD1 and VDD2 may be same or different. Cascade refers to connecting a series of same unit elements end to end so as to form a new unit. The connection relationships among the respective elements and the respective input and output signals are as shown in the FIG. 1.

A gate of the M1 is connected to both the signal input terminal INPUT and gates of the M6 and M9, a drain of the M1 is connected to the power supply terminal VDD1, and a source of the M1 is connected to drains of the M2 and M11. A gate of the M2 is connected to the signal input terminal RESET. Both a gate and a drain of the M5 are connected to the signal input terminal CLKB, and a source of the M5 is connected to drains of the M6 and M7. A source of the M8 is connected to the power supply terminal VDD2, a gate of the M8 is connected to the source of the M5, a drain of the M8 is connected to both drains of the M9 and M10 and gates of the M11 and M12; a drain of the M3 is connected to the signal input terminal CLK, a gate of the M3 is connected to one end of the capacitor C1 and the source of the M1, and a source of the M3 is connected to the other end of the capacitor C1, gates of the M7 and M10, drains of the M12 and M4 and the signal output terminal OUTPUT; sources of M2, M11, M6, M7, M9, M10, M12 and M4 are connected to the power supply terminal VSS, and a gate of the M4 is connected to the signal input terminal RESET.

Figure 2:
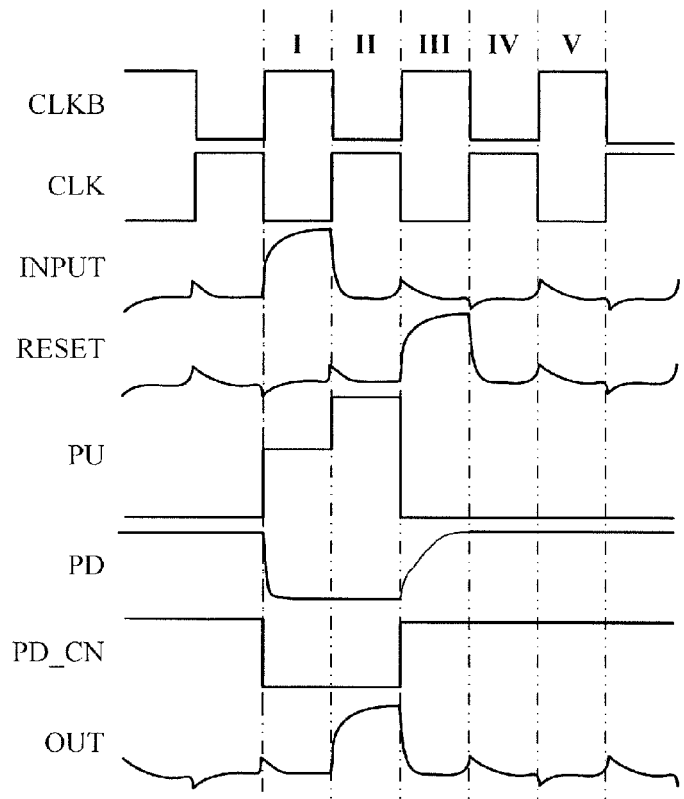
FIG. 2 is a operation timing diagram according to the first embodiment of the disclosure.

An operation timing (i.e., a control logic) designed for the circuit structure of the first embodiment is shown in the FIG. 2. Its operation principle may be divided into following five stages and will be described hereinafter.

The first stage (I stage): the INPUT is at the high level, the transistors M1, M6, M9 are turned-on, then a PU node is at the high level and the transistor M3 is turned-on; CLKB is at the high level, the transistor M5 is turned-on and the source of the M5 is at the high level at this time, and the transistors M11 and M12 would be turned-off if a PD node is at a low level by setting the proportion between Ratio of Width to Length (w/l Ratio) of channel of M5 and w/l Ratio of channel of M6 and the proportion between w/l Ratio of channel of M8 and w/l Ratio of channel of M9; RESET is at the low level, so the transistors M2 and M4 are turned-off; the CLK is at the low level, therefore the output OUTPUT is at the low level and M7 and M10 are turned-off.

During this stage, the M6 and M9 are turned-on when the INPUT is at the high level, therefore delay hardly exists and the potential of the PD node is pulled down rapidly, so that charging at the PU node is not affected. In particular, in a case of low-temperature, mobility of TFT (particularly, M1, M2, M11, M6, M7, M9 and M10) is decreased, the affection to the PU node is more obvious, even the potential of the PD node would be pulled down insufficiently because of over-slowly charging, and finally the shift register could not operate normally.

The second stage (II stage): the INPUT changes to the low level, and the transistors M1, M6 and M9 are turned-off, thus the PU node is still at the high level and the transistor M3 is still turned-on; the CLKB is at the low level, the transistors M5 and M8 are turned-off, then the PD node is still at the low level and the transistors M11 and M12 are still turned-off; the RESET is still at the low level, then the transistors M2 and M4 are still turned-off; the CLK changes to the high level, therefore the output OUTPUT changes to the high level, and the M7 and M10 are turned-on.

The third stage (III stage): the INPUT is still at the low level, and the transistors M1, M6 and M9 are still turned-off; the RESET changes to the high level, then the transistors M2 and M4 are turned-on; thus, the PU node is discharged to the low level, and the transistor M3 is turned-off; the CLKB is at the high level, the transistors M11 and M8 are turned-on, then the PD node changes to the high level, and the transistors M11 and M12 are turned-on; the VSS is at the low level, therefore the output OUTPUT changes to the low level, and the M7 and M10 are turned-off.

The fourth stage (IV stage): the INPUT is still at the low level, and the transistors M1, M6 and M9 are still turned-off; the RESET changes to the low level, then the transistors M2 and M4 are turned-off; the PU node is still at the low level, and the transistor M3 is still turned-off; the CLKB is at the low level, the transistor M5 is turned-off, then the PD node maintains the high level and the transistors M11 and M12 maintain to be turned-on; the VSS is at the low level, therefore the output OUTPUT remains the low level.

The fifth stage (V stage): the INPUT is still at the low level, and the transistors M1, M6 and M9 are still turned-off; the RESET is still at the low level, then the transistors M2 and M4 are still turned-off; the PU node is still at the low level, and the transistor M3 is still turned-off; the CLKB is at the high level, the transistor M5 is turned-on, then the PD node maintains the high level and the transistors M11 and M12 maintain to be turned-on; the VSS is at the low level, therefore the output OUTPUT remains the low level.

Thereafter, the states in the fourth and fifth stages are repeated until timings in the first, second and third stages appear again. Once the first, second and third stages are completed, one shift is realized.

Second Embodiment

Figure 3:
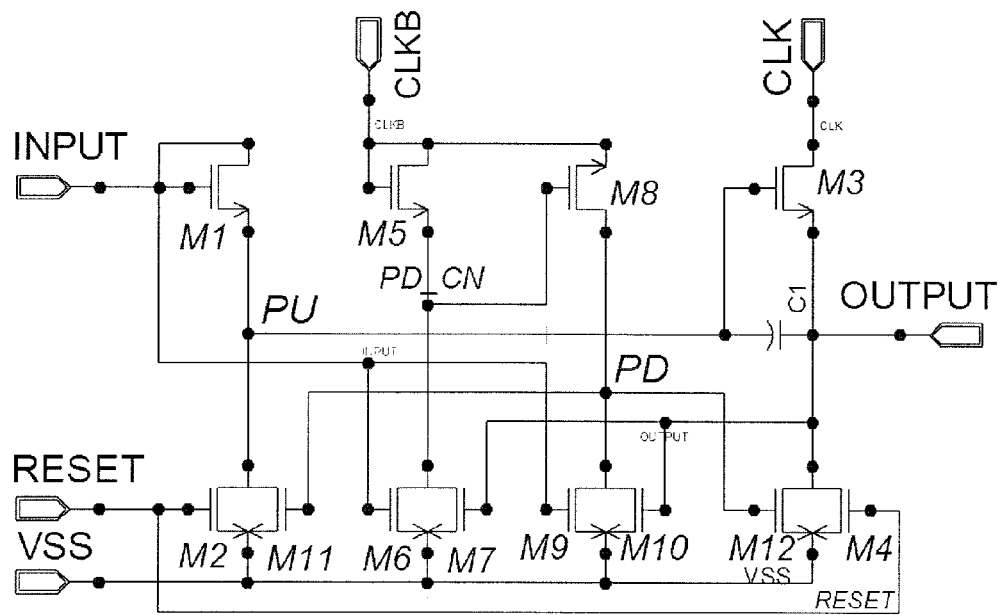
FIG. 3 is a circuit diagram of the shift register unit according to second embodiment of the disclosure.

In this approach, the direct current voltages VDD1, VDD2 are removed from the shift register unit. Its connection manner is shown in FIG. 3 and its connection relationships are as follows. Both a gate and a drain of the M1 are connected to both the signal input terminal INPUT and gates of the M6 and M9, and a source of the M1 is connected to drains of the M2 and M11. A gate of the M2 is connected to the signal input terminal RESET. Both a gate and a drain of the M5 are connected to the signal input terminal CLKB and a source of the M8, and a source of the M5 is connected to drains of the M6 and M7. A gate of the M8 is connected to the source of the M5, a drain of the M8 is connected to both drains of the M9, M10 and gates of the M11, M12. A drain of the M3 is connected to the signal input terminal CLK, a gate of the M3 is connected to one end of the capacitor C1 and the source of the M1, and a source of the M3 is connected to the other end of the capacitor C1, gates of the M7 and M10, drains of the M12 and M4 and the signal output terminal OUTPUT. Sources of M2, M11, M6, M7, M9, M10, M12 and M4 are connected to the power supply terminal VSS, and a gate of the M4 is connected to the signal input terminal RESET.

Figure 4:
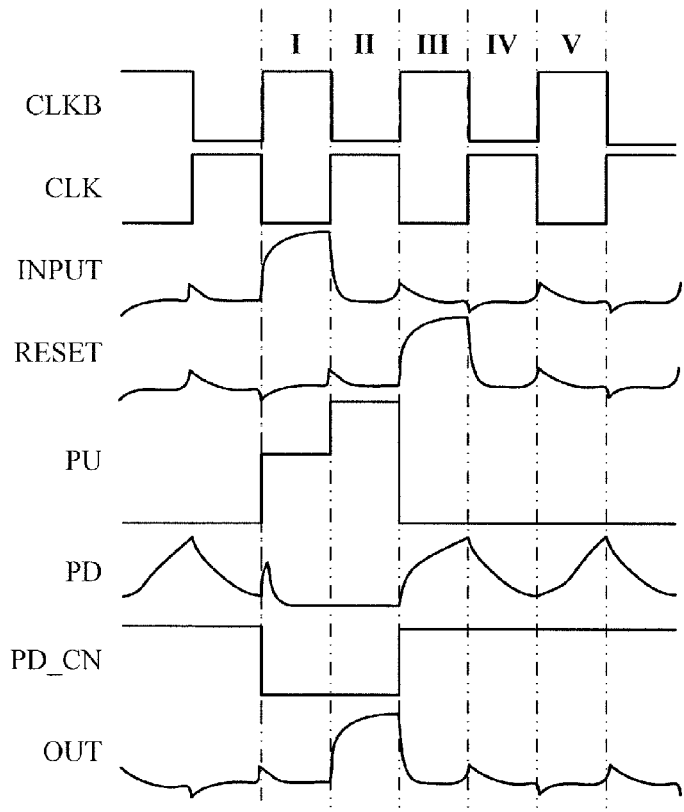
FIG. 4 is a operation timing diagram according to the second embodiment of the disclosure.

Herein, the VSS is always at the low level, and its driving timing is as shown in FIG. 4. The operation principle of this embodiment is essentially same as that of the first embodiment, but a main difference between them is in that the potential of the PD node would change by following the change of CLKB in the second embodiment, while this would not occur in the first embodiment. Since the VDD2 is removed in this approach, which enables that the potential of the PD change as the CLKB changes, bias voltages for the M11 and M12 are decreased and the lifespan of the shift register is propitious to be prolonged. Furthermore, as compared with the approach in the first embodiment, the second embodiment has advantages of less signal lines and easy layout or wiring because the direct current voltages VDD1, VDD2 are removed, however, the attenuations of the clock signal and the PU node are increased.

Third Embodiment

Figure 5:
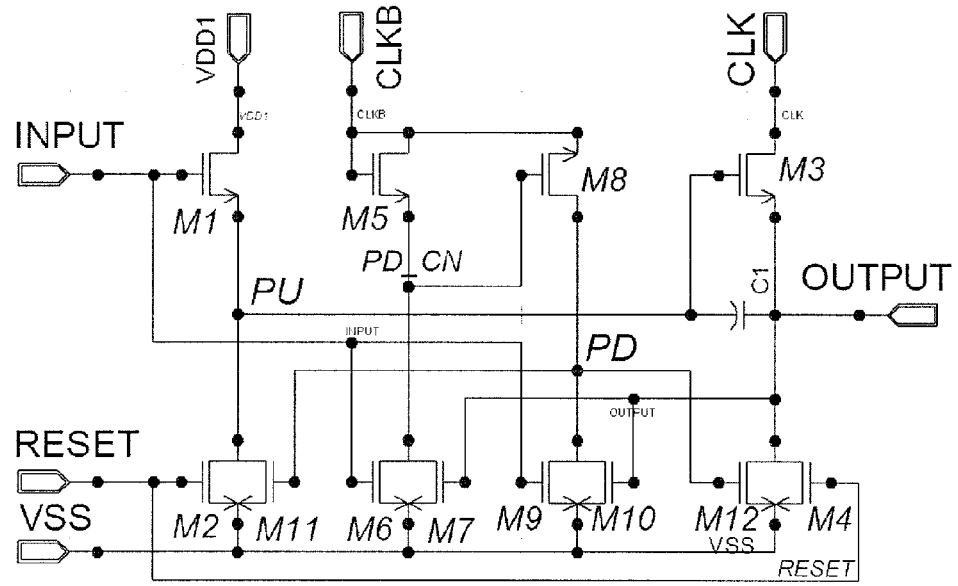
FIG. 5 is a circuit diagram of the shift register unit according to third embodiment of the disclosure.

As shown in FIG. 5, only the direct current voltage VDD2 is removed in this approach. A gate of the M1 is connected to both the signal input terminal INPUT and gates of the M6 and M9, a drain the M1 is connected to the power supply terminal VDD1, and a source the M1 is connected to drains of the M2 and M11. A gate of the M2 is connected to the signal input terminal RESET. Both a gate and a drain of the M5 are connected to the signal input terminal CLKB and a source of the M8, and a source of the M5 is connected to drains of the M6 and M7. A gate of the M8 is connected to the source of the M5, a drain of the M8 is connected to both drains of the M9 and M10 and gates of the M11 and M12. A drain of the M3 is connected to the signal input terminal CLK, a gate of the M3 is connected to one end of the capacitor C1 and the source of the M1, and a source of the M3 is connected to the other end of the capacitor C1, gates of the M7 and M10, drains of the M12 and M4 and the signal output terminal OUTPUT. Sources of M2, M11, M6, M7, M9, M10, M12 and M4 are connected to the power supply terminal VSS, and a gate of the M4 is connected to the signal input terminal RESET.

Herein, the VSS is always at the low level, and its driving timing is still as shown in FIG. 4. The operation principle of this embodiment is essentially same as that in the first embodiment, but a main difference between them is in that the potential of the PD node would change accordingly when the CLKB changes in the third embodiment, while this would not occur in the first embodiment. The advantages and disadvantages of this approach are same as those in the second embodiment. The only difference from the second embodiment is in that the attenuation of the PU node is reduced but the signal lines are a litter more.

Fourth Embodiment

Figure 1:
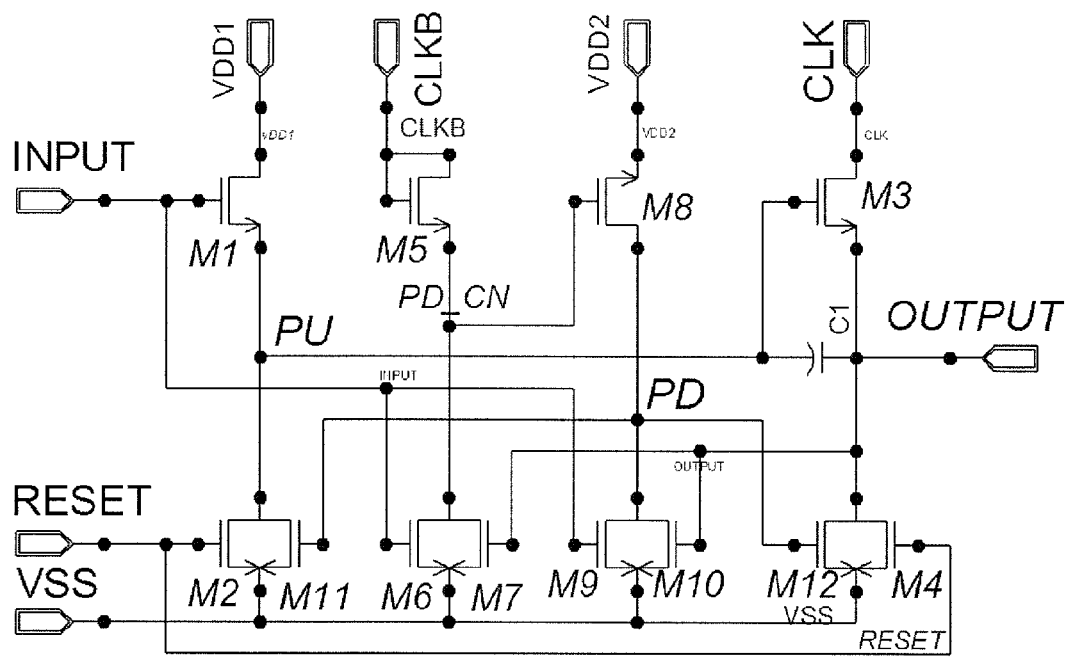
FIG. 1 is a circuit diagram of the shift register unit according to first embodiment of the disclosure.

This embodiment provides a shift register (which may comprises a plurality of shift register units, and may be formed by a cascade of the plurality of shift register units) including one or more shift register units as shown in FIGS. 1, 3 and 5.

Fifth Embodiment

The disclosure further provides a display panel (for example, a liquid crystal display panel) including the above-described shift register (as a gate driver).

Sixth Embodiment

The disclosure further provides a display (for example, a liquid crystal display) including the above-described display panel.

The above embodiments are to be considered only illustrative, but not restrictive to the present disclosure, and it will be appreciated by those ordinary in the related art that various changes and modifications may be made in these embodiments without departing from the spirit and scope of the present disclosure. Therefore, any and all of equivalent solutions will fall into the scope of the present disclosure, which is defined in the appended claims.

What is claimed is:
1. A shift register unit, comprising: twelve transistors M1, M2, M3, M4, M5, M6, M7, M8, M9, M10, M11, and, M12; one capacitor C1; four signal input terminals INPUT, RESET, CLK, CLKB; one signal output terminal OUTPUT; and one power supply terminal VSS, and connection relationships among them are as follows:
  a gate of the M1 is connected to both the signal input terminal INPUT and gates of the M6 and M9, and a source of the M1 is connected to drains of the M2 and M11;
  a gate of the M2 is connected to the signal input terminal RESET;
  both a gate and a drain of the M5 are connected to the signal input terminal CLKB, and a source of the M5 is connected to drains of the M6 and M7;
  a gate of the M8 is connected to the source of the M5, a drain of the M8 is connected to both drains of the M9 and M10 and gates of the M11 and M12;
  a drain of the M3 is connected to the signal input terminal CLK, a gate of the M3 is connected to one end of the capacitor C1 and the source of the M1, and a source of the M3 is connected to the other end of the capacitor C1, gates of the M7 and M10, drains of the M12 and M4 and the signal output terminal OUTPUT;

sources of M2, M11, M6, M7, M9, M10, M12 and M4 are connected to the power supply terminal VSS, and a gate of the M4 is connected to the signal input terminal RESET;

said shift register unit further comprises two additional signal input terminals: fifth signal input terminal and sixth signal input terminal, a drain of the M1 is connected to the fifth signal input terminal, and when the gate of the M1 is at the high level, the signal input terminal at the drain of the M1 is also at a high level; a source of the M8 is connected to the sixth signal input terminal, and when the gate of the M8 is at the high level, the signal input terminal at the source of the M8 is also at a high level.

2. The shift register unit of claim 1, wherein the shift register unit further comprises two power supply terminals VDD1 and VDD2; the fifth signal input terminal connected with the drain of the M1 is connected to said power supply terminal VDD1; and the sixth signal input terminal connected with the source of the M8 is connected to the power supply terminal VDD2.

3. The shift register unit of claim 1, wherein the fifth signal input terminal connected with the drain of the M1 is connected to said signal input terminal INPUT, and the drain of the M1 is further connected to gates of the M6 and M9; the sixth signal input terminal connected with the source of the M8 is connected to the signal input terminal CLKB, and the source of the M8 is further connected to both the gate and the drain of the M5.

4. The shift register unit of claim 1, wherein the shift register unit further comprises one power supply terminal VDD1; the fifth signal input terminal connected with the drain of the M1 is connected to said power supply terminal VDD1; the sixth signal input terminal connected with the source of the M8 is connected to the signal input terminal CLKB, and the source of the M8 is further connected to both the gate and the drain of the M5.

5. A shift register, comprising a plurality of shift register units, each shift register unit comprises: twelve transistors M1, M2, M3, M4, M5, M6, M7, M8, M9, M10, M11 and, M12; one capacitor C1; four signal input terminals INPUT, RESET, CLK, CLKB; one signal output terminal OUTPUT; and one power supply terminal VSS, and connection relationships among them are as follows:

a gate of the M1 is connected to both the signal input terminal INPUT and gates of the M6 and M9, and a source of the M1 is connected to drains of the M2 and M11;

a gate of the M2 is connected to the signal input terminal RESET;

both a gate and a drain of the M5 are connected to the signal input terminal CLKB, and a source of the M5 is connected to drains of the M6 and M7;

a gate of the M8 is connected to the source of the M5, a drain of the M8 is connected to both drains of the M9 and M10 and gates of the M11 and M12; a drain of the M3 is connected to the signal input terminal CLK, a gate of the M3 is connected to one end of the capacitor C1 and the source of the M1, and a source of the M3 is connected to the other end of the capacitor C1, gates of the M7 and M10, drains of the M12 and M4 and the signal output terminal OUTPUT;

sources of M2, M11, M6, M7, M9, M10, M12 and M4 are connected to the power supply terminal VSS, and a gate of the M4 is connected to the signal input terminal RESET;

said shift register unit further comprises two additional signal input terminals: fifth signal input terminal and sixth signal input terminal, a drain of the M1 is connected to the fifth signal input terminal, and when the gate of the M1 is at the high level, the signal input terminal at the drain of the M1 is also at a high level; a source of the M8 is connected to the sixth signal input terminal, and when the gate of the M8 is at the high level, the signal input terminal at the source of the M8 is also at a high level.

6. The shift register of claim 5, wherein the shift register unit further comprises two power supply terminals VDD1 and VDD2; the fifth signal input terminal connected with the drain of the M1 is connected to said power supply terminal VDD1; and the sixth signal input terminal connected with the source of the M8 is connected to the power supply terminal VDD2.

7. The shift register of claim 5, wherein the fifth signal input terminal connected with the drain of the M1 is connected to said signal input terminal INPUT, and the drain of the M1 is further connected to gates of the M6 and M9; the sixth signal input terminal connected with the source of the M8 is connected to the signal input terminal CLKB, and the source of the M8 is further connected to both the gate and the drain of the M5.

8. The shift register of claim 5, wherein the shift register unit further comprises one power supply terminal VDD1; the fifth signal input terminal connected with the drain of the M1 is connected to said power supply terminal VDD1; the sixth signal input terminal connected with the source of the M8 is connected to the signal input terminal CLKB, and the source of the M8 is further connected to both the gate and the drain of the M5.

9. The shift register of claim 5, wherein the shift register comprises a cascade of said plurality of shift register units.

10. A display panel, comprising a shift register as a gate driver of the display panel, said shift register includes a plurality of shift register units, each shift register unit comprises: twelve transistors M1, M2, M3, M4, M5, M6, M7, M8, M9, M10, M11, and, M12; one capacitor C1; four signal input terminals INPUT, RESET, CLK, CLKB; one signal output terminal OUTPUT; and one power supply terminal VSS, and connection relationships among them are as follows:

a gate of the M1 is connected to both the signal input terminal INPUT and gates of the M6 and M9, and a source of the M1 is connected to drains of the M2 and M11; a gate of the M2 is connected to the signal input terminal RESET;

both a gate and a drain of the M5 are connected to the signal input terminal CLKB, and a source of the M5 is connected to drains of the M6 and M7;

a gate of the M8 is connected to the source of the M5, a drain of the M8 is connected to both drains of the M9 and M10 and gates of the M11 and M12;

a drain of the M3 is connected to the signal input terminal CLK, a gate of the M3 is connected to one end of the capacitor C1 and the source of the M1, and a source of the M3 is connected to the other end of the capacitor C1, gates of the M7 and M10, drains of the M12 and M4 and the signal output terminal OUTPUT;

sources of M2, M11, M6, M7, M9, M10, M12 and M4 are connected to the power supply terminal VSS, and a gate of the M4 is connected to the signal input terminal RESET;

said shift register unit further comprises two additional signal input terminals: fifth signal input terminal and sixth signal input terminal, a drain of the M1 is connected to the fifth signal input terminal, and when the gate of the M1 is at the high level, the signal input terminal at the drain of the M1 is also at a high level; a source of the M8 is connected to the sixth signal input terminal, and when the gate of the M8 is at the high level, the signal input terminal at the source of the M8 is also at a high level.

11. The display panel of claim 10, wherein the shift register unit further comprises two power supply terminals VDD1 and VDD2; the fifth signal input terminal connected with the drain of the M1 is connected to said power supply terminal VDD1; and the sixth signal input terminal connected with the source of the M8 is connected to the power supply terminal VDD2.

12. The display panel of claim 10, wherein the fifth signal input terminal connected with the drain of the M1 is connected to said signal input terminal INPUT, and the drain of the M1 is further connected to gates of the M6 and M9; the sixth signal input terminal connected with the source of the M8 is connected to the signal input terminal CLKB, and the source of the M8 is further connected to both the gate and the drain of the M5.

13. The display panel of claim 10, wherein the shift register unit further comprises one power supply terminal VDD1; the fifth signal input terminal connected with the drain of the M1 is connected to said power supply terminal VDD1; the sixth signal input terminal connected with the source of the M8 is connected to the signal input terminal CLKB, and the source of the M8 is further connected to both the gate and the drain of the M5.

14. A display, comprising a display panel, the display panel comprises a shift register as a gate driver of the display panel, said shift register includes a plurality of shift register units, each shift register unit comprises: twelve transistors M1, M2, M3, M4, M5, M6, M7, M8, M9, M10, M11, and, M12; one capacitor C1; four signal input terminals INPUT, RESET, CLK, CLKB; one signal output terminal OUTPUT; and one power supply terminal VSS, and connection relationships among them are as follows:

a gate of the M1 is connected to both the signal input terminal INPUT and gates of the M6 and M9, and a source of the M1 is connected to drains of the M2 and M11;

a gate of the M2 is connected to the signal input terminal RESET;

both a gate and a drain of the M5 are connected to the signal input terminal CLKB, and a source of the M5 is connected to drains of the M6 and M7;

a gate of the M8 is connected to the source of the M5, a drain of the M8 is connected to both drains of the M9 and M10 and gates of the M11 and M12;

a drain of the M3 is connected to the signal input terminal CLK, a gate of the M3 is connected to one end of the capacitor C1 and the source of the M1, and a source of the M3 is connected to the other end of the capacitor C1, gates of the M7 and M10, drains of the M12 and M4 and the signal output terminal OUTPUT;

sources of M2, M11, M6, M7, M9, M10, M12 and M4 are connected to the power supply terminal VSS, and a gate of the M4 is connected to the signal input terminal RESET;

said shift register unit further comprises two additional signal input terminals: fifth signal input terminal and sixth signal input terminal, a drain of the M1 is connected to the fifth signal input terminal, and when the gate of the M1 is at the high level, the signal input terminal at the drain of the M1 is also at a high level; a source of the M8 is connected to the sixth signal input terminal, and when the gate of the M8 is at the high level, the signal input terminal at the source of the M8 is also at a high level.

15. The display of claim 14, wherein the shift register unit further comprises two power supply terminals VDD1 and VDD2; the fifth signal input terminal connected with the drain of the M1 is connected to said power supply terminal VDD1; and the sixth signal input terminal connected with the source of the M8 is connected to the power supply terminal VDD2.

16. The display of claim 14, wherein the fifth signal input terminal connected with the drain of the M1 is connected to said signal input terminal INPUT, and the drain of the M1 is further connected to gates of the M6 and M9; the sixth signal input terminal connected with the source of the M8 is connected to the signal input terminal CLKB, and the source of the M8 is further connected to both the gate and the drain of the M5.

17. The display of claim 14, wherein the shift register unit further comprises one power supply terminal VDD1; the fifth signal input terminal connected with the drain of the M1 is connected to said power supply terminal VDD1; the sixth signal input terminal connected with the source of the M8 is connected to the signal input terminal CLKB, and the source of the M8 is further connected to both the gate and the drain of the M5.

* * * * *